United States Patent [19]

Hayashi et al.

[11] Patent Number: 5,413,988
[45] Date of Patent: May 9, 1995

[54] METHOD FOR MANUFACTURING AN OXIDE SUPERCONDUCTOR THIN FILM AND A TARGET FOR USE IN THE METHOD

[75] Inventors: Kunihiko Hayashi; Shuichi Fujino; Youichi Enomoto; Shoji Tanaka, all of Tokyo, Japan

[73] Assignees: International Superconductivity Technology Center; Mitsubishi Materials Corporation, both of Tokyo, Japan

[21] Appl. No.: 227,004

[22] Filed: Apr. 13, 1994

[30] Foreign Application Priority Data

Apr. 16, 1993 [JP] Japan ................... 5-090201

[51] Int. Cl.$^6$ ............... C30B 15/00; B05D 3/106; B05D 5/12
[52] U.S. Cl. .................... 505/511; 505/474; 505/473; 505/729; 505/732; 427/62; 427/596; 427/126.3; 117/13
[58] Field of Search .......... 505/474, 473, 511, 732, 505/729; 427/596, 62, 126.3; 117/13

[56] References Cited

U.S. PATENT DOCUMENTS 5,077,269 12/1991 Sugihara et al. ................ 505/511

FOREIGN PATENT DOCUMENTS 4-119968 4/1992 Japan .

OTHER PUBLICATIONS

Ren et al, "Epitaxial Growth of Yttrium Barium Copper Oxide ($YBa_2Cu_3O_{7-\delta}$) Superconducting Thin Films by D.C. Magnetic Sputtering Using a Partially Melted Sintered Target," Appl. Phys. A. A54(3)1992, pp. 303–307.
Inoue et al, "Localized Electrons Around Cu Atoms of Superconductor, Tetragonal $YBa_2Cu_{3-x}O_{7-y}$", Jpn. J. Appl. Phys. 26(9) Aug. 1987 pp. L1365–L1367.

Primary Examiner—Roy V. King
Attorney, Agent, or Firm—Frishauf, Holtz, Goodman & Woodward

[57] ABSTRACT

An oxide superconductor thin film of $Y_{1\pm\alpha}Ba_{2\pm\beta}Cu_{3\pm\gamma}O_{7-\delta}$ with a smooth surface having a low density of particles being generated without decreasing superconductivity is produced by the steps of applying a pulsed laser beam to the target formed of an oxide material having an apparent density of 95% or more, substantially composed of $Y_{1\pm\alpha}Ba_{2\pm\beta}Cu_{3\pm\gamma}O_{7-\delta}$, which is obtained from a molded body of an amorphous powder by subjecting it to partial melting, followed by gradual cooling, depositing and accumulating an irradiated and evaporated oxide material of the target on a substrate.

14 Claims, 2 Drawing Sheets

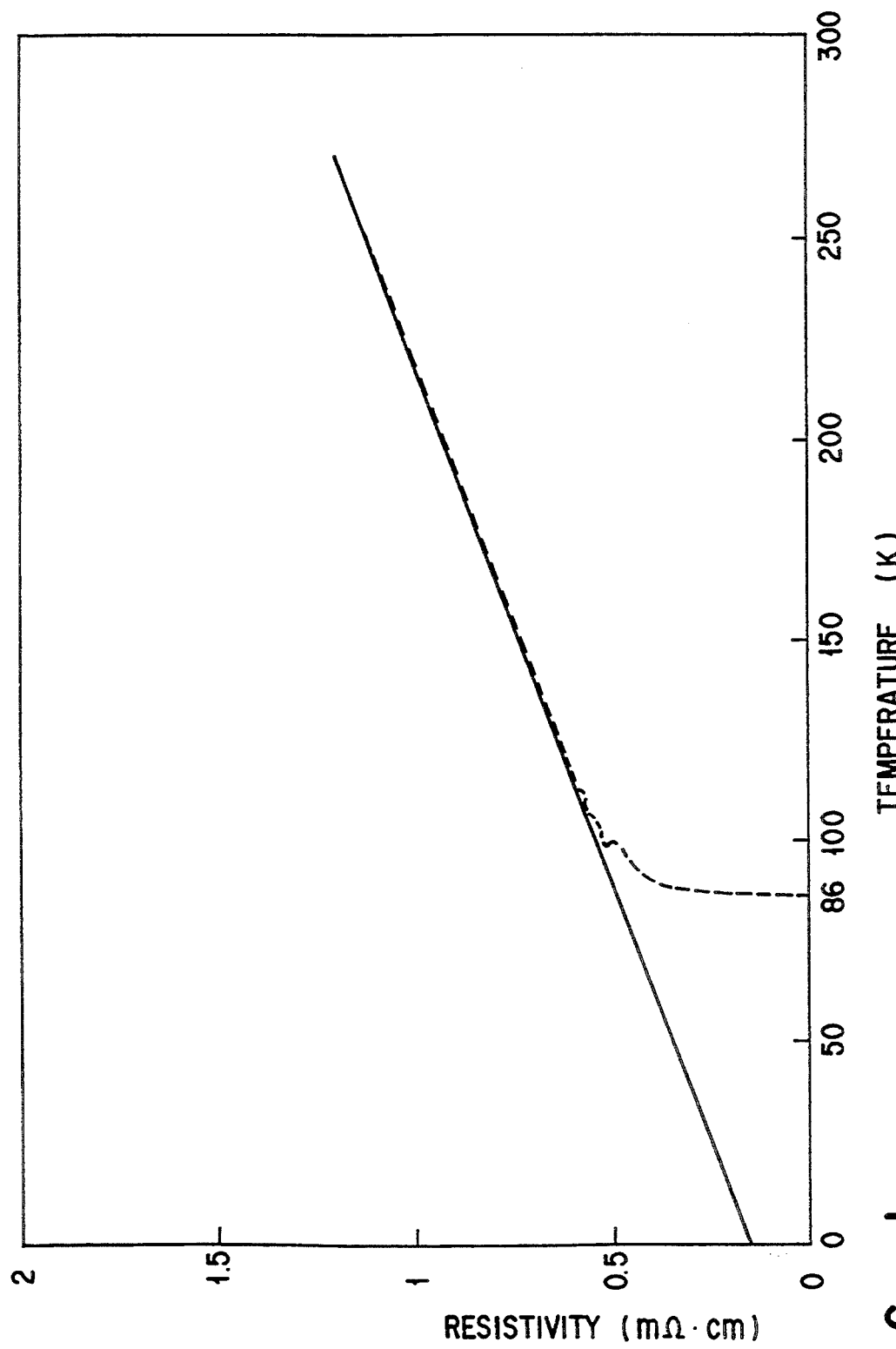
F I G. 1

METHOD FOR MANUFACTURING AN OXIDE SUPERCONDUCTOR THIN FILM AND A TARGET FOR USE IN THE METHOD

BACKGROUND OF THE INVENTION

1. Field of the Invention

The present invention relates to a method for manufacturing an oxide superconductor thin film excellent in surface morphology.

2. Description of the Related Art

Since the discovery of oxide superconductors with high critical temperatures, researches on methods of manufacturing oxide thin films have greatly advanced. Hereinafter, the critical temperature will be referred to as "Tc". Of such methods, the most widely used is a method comprising the steps of applying a laser beam to a target made of an oxide material to evaporate the oxide material, and then depositing and accumulating the evaporated material on a substrate. In this method, since the thin film is formed in an atmosphere with a high oxygen partial pressure, oxygen can be incorporated sufficiently into the oxide thin film. Further, this method can easily form a thin film whose composition similar or substantially same to that of the target. Therefore, the formed film can be used as a superconductor film as it is without any further treatment.

However, in this method, a laser beam applied to a target at a high radiation energy density, possibly deteriorates the target. In addition, the thin film formed by this method have numerous particles of approximately 1 $\mu m$ in diameter on its surface, unlike thin films made by other methods such as a sputter method and a vacuum evaporation method. These particles markedly lower the surface morphology. In this case, when a plurality of films of poor surface morphology are laid one upon another to form a multi layered film or a laminated type junction, the interface between the layers becomes a non-homogeneous condition. Due to the non-homogeneous condition, it is difficult to accurately evaluate the properties of each of the formed thin films. Heretofore, many attempts have been made with a view toward reducing the particle generation.

In an attempt, a thin film was formed by a conventional method under such a condition as to reduce the density of particles being generated. However, the superconductivity of thus-formed film was found to have deteriorated. Heretofore, no methods for forming a thin film having both of an excellent morphology (a smooth surface) and superconductivity, have yet been proposed.

SUMMARY OF THE INVENTION

The present inventors have investigated and researched the causes for particles being generated in the conventional method. It is found that the cause was present in a target. To be more specific, a conventional target manufactured by sintering raw powder material of fine grains has numerous void spaces (the apparent density of 90% or less) and extremely fine crystal particles as small as approximately $10\mu$ in diameter. Therefore, when a laser beam is applied to a conventional target, not only crystal surfaces but also the inner void spaces and grain boundaries are irradiated. As a result of irradiation, the temperature of the target abruptly increases, and then, the target melts. However, due to a laser beam applied to the inner void spaces and the grain boundaries, fine powder is scattered away from the target before and after the melting of the target. The present inventors assumed the scattered powder to be a cause of particles.

On the basis of their findings, the present inventors have conducted intensive and extensive studies in an effort to solve the problem of particles being generated in a conventional method. As a result, they have succeeded in increasing the apparent density of a target to avoid the radiation to the inner void spaces, and in increasing the diameter of a crystal grain to larger than that of a laser beam, without lowering mechanical strength of the target. Thus have been made the present invention.

It is an object of the present invention to provide a method for manufacturing an oxide superconductor thin film having an excellent morphology (a smooth surface), by reducing the density of particles without decreasing superconductivity, and also to provide a target for use in the method.

In order to achieve the above-mentioned object, the method for manufacturing an oxide superconductor thin film of the present invention, comprises the steps of:

preparing a target having an apparent density of 95% or more and substantially composed of an oxide material represented by $Y_{1\pm\alpha}Ba_{2\pm\beta}Cu_{3\pm\gamma}O_{7-\delta}$ ($\alpha \leqq 0.8$, $\beta \leqq 0.4$, $\gamma \leqq 0.4$, $-2 \leqq \delta \leqq 1$); and forming a thin film substantially composed of $Y_{1\pm\alpha}Ba_{2\pm\beta}Cu_{3\pm\gamma}O_{7-\delta}$ ($\alpha \leqq 0.8$, $\beta \leqq 0.4$, $\gamma \leqq 0.4$, $-2 \leqq \delta \leqq 1$) on a substrate by applying a laser beam to the target.

The reason for limiting $\alpha$, $\beta$, $\gamma$, and $\delta$ to the above-mentioned composition range is that a thin film within this range can provide properties of an oxide superconductor. Further, in the present invention, when a $Y_2BaCuO_5$ phase is diffused among crystal grains in order to strengthen the target, the precipitating particles are desired to have a diameter of $1\mu$ or less and contained in an amount of 40% or less in the crystal grains.

The aforementioned target can be manufactured according to a method for manufacturing bulk as described in, for example, Jpn. Pat. Appln. KOKAI Publication No. 4-119968, which is a priority document of U.S. Pat. Ser. No. 07/606,207 and the continuation application thereof, Ser. No. 08/073,656. By way of example, one of the methods in the above-mentioned applications will be briefly described below. According to this method (hereinafter the method is referred to as "MPMG method"), bulk is obtained as follows:

raw material powder for a Y-Ba-Cu-O series oxide superconductor or a material produced by a general sintering method is heated to high temperatures to obtain a partial liquid phase;

the heated material is solidified by cooling;

the solidified material is pulverized and mixed to allow the texture diffused homogeneously;

the pulverized and mixed powder is molded in a predetermined form; and the molded body is heated to develop a partial liquid phase therein resulting in a superconductor body.

Bulk obtained by the MPMG method has an apparent density of 95% or more and crystal grains of 1 mm or more in diameter. Further, a $Y_2BaCuO_5$ phase of 1 $\mu m$ or less in diameter can be diffused in an amount of 40% or less in the crystal grains. Thus-obtained bulk has a mechanical strength of 1.6 to 2.1 $MPam^{\frac{1}{2}}$ in terms of the fracture toughness Kc and 7 GPa or more in terms of the Vickers hardness Hv by virtue of the $Y_2BaCuO_5$ phase diffused among the crystal grains.

Further, the present invention provides a method for manufacturing an oxide superconductor thin film and a target for use in the method, comprising the steps of:

preparing a target having a single crystalline oxide material composed of $Y_{1\pm\alpha}Ba_{2\pm\beta}Cu_{3\pm\gamma}O_{7-\delta}$ ($\alpha\leq0.8$, $\beta\leq0.4$, $\gamma\leq0.4$, $-2\leq\delta\leq1$); and forming a thin film substantially composed of $Y_{1\pm\alpha}Ba_{2\pm\beta}Cu_{3\pm\gamma}O_{7-\delta}$ ($\alpha\leq0.8$, $\beta\leq0.4$, $\gamma\leq0.4$, $-2\leq\delta\leq1$) on a substrate by applying a laser beam to the target.

This target, which is usually formed by the well-known Czochralski method, such as rotation upward drawing process and upward drawing process, is a single crystal having an apparent density of 100%.

In the present invention, to the target made of thus-obtained bulk, a pulsed laser beam is applied to scatter the oxide material away from the target and the material is deposited through evaporation on a substrate. The preferable partial oxygen pressure of an atmosphere used for the laser radiation is 10 to 40 Pa. Preferable pulsed laser beam to be used for radiation is a KrF excimer, an ArF excimer, or a YAG laser. The preferable optical amount of a laser beam falls within the range from $3J/cm^2$ to $8J/cm^2$. The preferable beam diameter falls within the range from $0.5\times0.5$ mm to $4.0$ mm$\times4.0$ mm. The effect from reducing the diameter of a laser beam and a radiation area to smaller than that of a crystal grain is substantially equivalent to that from applying a laser beam to a single crystalline bulk (a target). To be more specific, since void spaces and grain boundaries are not irradiated, the formed films are free from an adverse influence from the radiation applied to void spaces and grain boundaries. As a substrate, MgO, $SrTiO_3$, $LaAlO_3$, or the like is used. The thickness of thin film deposited on the substrate through evaporation is preferred to be 50 nm to 1 $\mu$m. This thin film possess superconductivity as it is.

According to the method for manufacturing an oxide thin film of the present invention using the above-explained pulsed laser, by virtue of a single crystalline target, or a target having a high apparent density, preferably having crystal grains which is large enough to function substantially equivalent to a single crystal against a laser beam, a thin film can be obtained having an excellent surface morphology without particles on the surface. Consequently, a multi-layered type tunnel junction, a laminated film, and the like having an excellent superconductivity can be easily manufactured.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a graph showing the dependency of inherent resistance on temperature with respect to the thin film obtained in Example 1.

DETAILED DESCRIPTION OF THE PREFERRED EMBODIMENTS

Example 1

Figure 2:
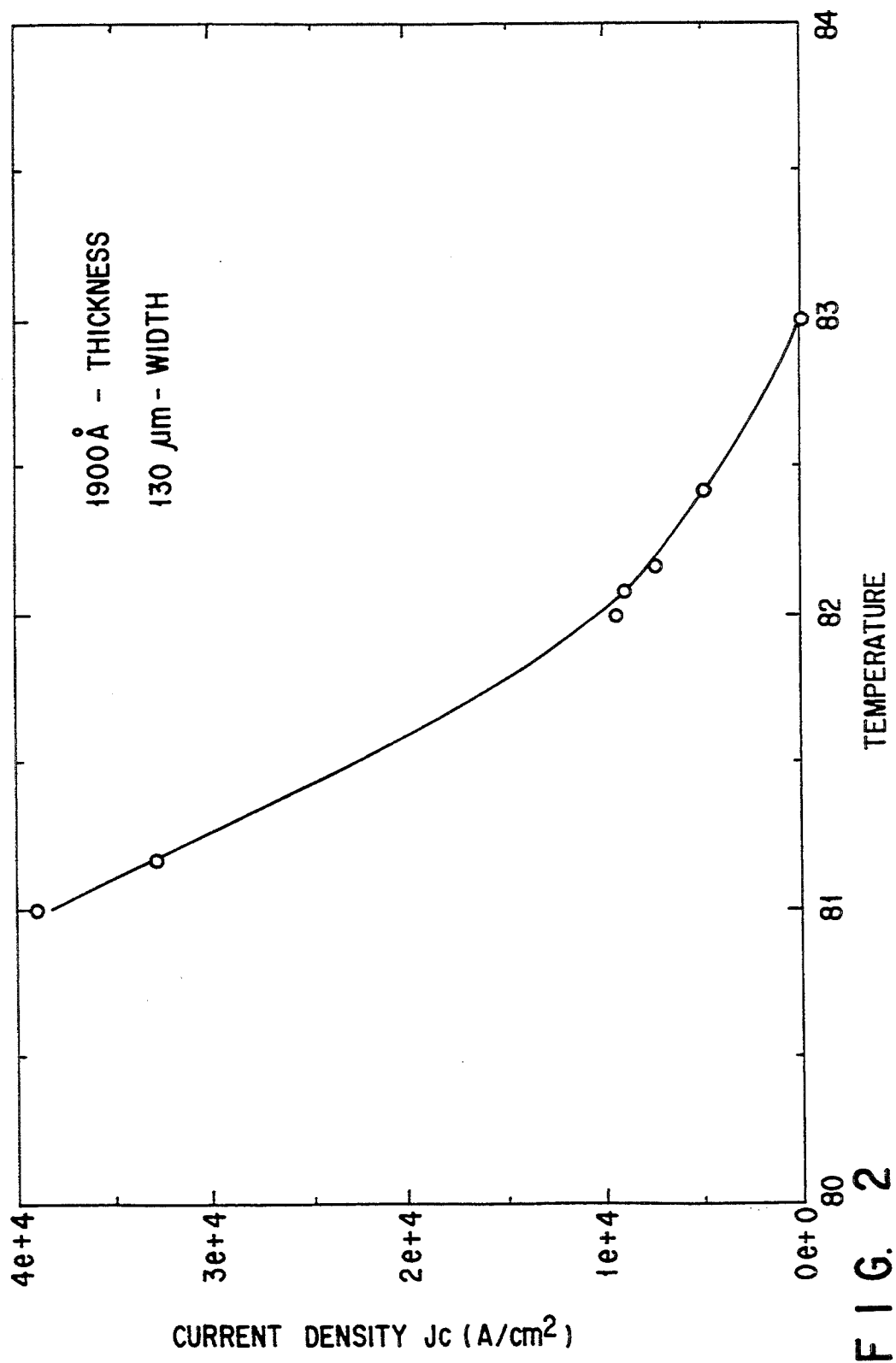
FIG. 2 is a graph showing the dependency of critical current density (Jc) on temperature with respect to the thin film obtained by a method for Example 1.

A target was produced according to the MPMG method. This target was composed of 60 mol % $Y_{1\pm\alpha}Ba_{2\pm\beta}Cu_{3\pm\gamma}O_{7-\delta}$ ($\alpha=0.05$, $\beta=0.1$, $\gamma=0.05$, and $\delta=0.05$) and 40 mol % $Y_2BaCuO_5$. The target had an apparent density of 95% and crystal grains of at least 1 mm in diameter. Among the crystal grains, a $Y_2BaCuO_5$ phase of 1 $\mu$m or less in diameter was diffused in an amount of 40%. To this target, a Kr-F excimer laser ($\lambda=248$ nm) having a laser beam amount of $5J/cm^2$ and a beam diameter of $1\times2$ mm was applied at a ratio of approximately 5 Hz, thereby forming a thin film of 200 nm in thickness on a MgO (100) substrate. The oxygen pressure was set to 40 Pa and the substrate temperature was set to 750° C. Under the same condition as above, a thin film was manufactured of a conventional target produced according to the hot-press method for comparison. The composition of the conventional target was $Y_{1\pm\alpha}Ba_{2\pm\beta}Cu_{3\pm\gamma}O_{7-\delta}$. An apparent density of the conventional target was 90%, and the diameter of crystal grains was at most 0.1 mm.

The surfaces of the thin films made of the targets of Example 1 and of the comparative sample were observed under an optical microscope. Particles on the thin film of Example 1 were $10^6$ per $cm^2$, which was 1/10 the order of numbers of that of the conventional thin film.

The thin film obtained in Example 1 was checked for the dependence of inherent resistance on temperature and the dependence of critical current density on temperature. The results are shown in FIGS. 1 and 2. It is apparent from the result that the thin film of the Example 1 acquires a good surface condition and sufficient superconductivity.

Example 2

A target was prepared according to the MPMG method. The composition of the target was $Y_{1\pm\alpha}Ba_{2\pm\beta}Cu_{3\pm\delta}O_{7-\delta}$, in which $\alpha=0.05$, $\beta=0.1$, $\gamma=0.05$, and $\delta=0.05$. The target had an apparent density of 95%, and crystal grains of at least 1 mm in diameter. Among crystal grains of the target, a $Y_2BaCuO_5$ phase of $1\mu$ in an average diameter was diffused. A thin film was manufactured by using the target in the same manner as in Example 1.

When observed under an optical microscope, the surface of the film of the Example 2 had particles in the number of 1/10 the order of numbers of that of the conventional film shown in Example 1. Fine crystal grains oriented along the a and b-axes were observed to partially grow besides a region of crystal grains oriented along the c-axis. The dependence of inherent resistance on temperature and the dependence of critical current density on temperature of the thin film of Example 2 were equivalent to those of the thin film of Example 1. It was found that both properties of the thin film demonstrated good superconductivity.

Example 3

Thin films were formed on the substrate by varying the composition (a molar ratio) of a target, a crystal grain diameter, and an apparent density. Tc and the number of particles of the thin films were determined. The results are shown in Table 1.

Using targets outside the scope of the present invention, thin film was formed and the physical properties thereof were determined in the same manner as above. The results are also shown in columns of a comparative sample and a conventional sample of Table 1. The target of the comparative sample had the same composition as that of No. 3-1 of Table 1, an apparent density of 90%, and a crystal grain diameter of 0.1 mm. The target of the conventional sample had a composition of $Y_1Ba_2Cu_3O_{7-\delta}$, an apparent density of 90%, and a crystal grain diameter of 0.1 mm. Thin films were formed under the radiation condition as follows: a laser beam wavelength of 248 nm, a radiation power of 5J/cm², a beam diameter of either 1.0 mm×1.0 mm or 1.5 mm×2.5 mm, a radiation area of either 5 mm×5 mm or 50 mm×50 mm. Since a laser has a beam diameter of 1.0 mm×1.0 mm and a radiation area of 5 mm×5 mm as compared to 5 mm of a crystal grain diameter of the target in sample Nos. 3-2 and 3-6, the target substantially works as a single crystal at the time of radiation.

It is apparent from Table 1 that the number of particles can be reduced by setting an apparent density to 95% or more, particularly by adjusting a crystal grain diameter to 1 mm or more. Furthermore, by increasing a crystal grain diameter much larger than a beam diameter, the number of particles can be significantly reduced, for a laser beam is substantially applied to a single crystal.

Example 4

A target having composition of $Y_{1\pm\alpha}Ba_{2\pm\beta}Cu_{3\pm\gamma}O_{7-\delta}$ ($\alpha=0.05$, $\beta=0.1$, $\gamma=0.05$, and $\delta=0.05$) and its apparent density of 100% was prepared according to Czochralski method. A thin film of 20 nm in thickness was formed on MgO (100) substrate by applying a Kr-F excimer laser ($\lambda=248$ nm) having a beam amount of 5J/cm² and a beam diameter of 1×2 mm to the target at a rate of 10 Hz. The oxygen pressure was 20 Pa and the substrate temperature was 750° C.

When observed under an optical microscope, the surface of the film of the Example 4 had particles in 1/10 the order of number of that of the thin film formed of the conventional target shown in Example 1. The thin film obtained in Example 4 had the same dependence of inherent resistance on temperature and the same dependence of critical current density on temperature as those of Example 1. It was found that the obtained thin films had a good surface morphology and sufficient superconductivity.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

TABLE 1

| | | Target | | Condition for evaporation | | | | Result | |
|---|---|---|---|---|---|---|---|---|---|
| | No. | Composition (Molar %) | Apparent density | Crystal grain size | $\lambda$ | Power | Beam (mm) | Radiation area (mm) | Tc | Particles |
| Sample | 3-1 | $Y_{1.8}Ba_{2.4}Ca_{3.4}O_{7-\delta}$ | 98% | 5 mm | 248 nm | 5 J/cm² | 1.5 × 2.5 | 50 × 50 | 84K | 2.2 × 10⁶/cm² |
| Sample | 3-2 | $Y_{1.8}Ba_{2.4}Ca_{3.4}O_{7-\delta}$ | 98% | 5 mm | 248 nm | 5 J/cm² | 1.0 × 1.0 | 5 × 5 | 86K | 2.1 × 10⁶/cm² |
| Sample | 3-3 | $Y_{1.0}Ba_{2.0}Cu_{3.0}O_{7-\delta}$ | 98% | 2-3 mm | 248 nm | 5 J/cm² | 1.5 × 2.5 | 50 × 50 | 84K | 2.3 × 10⁶/cm² |
| Sample | 3-4 | $Y_{1.8}Ba_{2.4}Cu_{3.0}O_{7-\delta}$ | 98% | 1 mm | 248 nm | 5 J/cm² | 1.5 × 2.5 | 50 × 50 | 86K | 2.5 × 10⁶/cm² |
| Sample | 3-5 | $Y_{1.8}Ba_{2.4}Cu_{3.0}O_{7-\delta}$ | 95% | 5 mm | 248 nm | 5 J/cm² | 1.5 × 2.5 | 50 × 50 | 86K | 2.6 × 10⁶/cm² |
| Sample | 3-6 | $Y_{1.8}Ba_{2.4}Cu_{3.0}O_{7-\delta}$ | 95% | 5 mm | 248 nm | 5 J/cm² | 1.0 × 1.0 | 5 × 5 | 86K | 2.4 × 10⁶/cm² |
| Sample | 3-7 | $Y_{1.0}Ba_{2.0}Cu_{3.0}O_{7-\delta}$ | 95% | 2-3 mm | 248 nm | 5 J/cm² | 1.5 × 2.5 | 50 × 50 | 86K | 2.6 × 10⁶/cm² |
| Sample | 3-8 | $Y_{1.8}Ba_{2.4}Ca_{3.4}O_{7-\delta}$ | 95% | 1 mm | 248 nm | 5 J/cm² | 1.5 × 2.5 | 50 × 50 | 86F | 3.0 × 10⁶/cm² |
| Comparative | | $Y_{1.8}Ba_{2.4}Ca_{3.4}O_{7-\delta}$ | 90% | 0.1 mm | 248 nm | 5 J/cm² | 1.5.2.5 | 50 × 50 | 86K | 2.5 × 10⁷/cm² |
| Conventional sample | | $Y_{1.0}Ba_{2.0}Cu_{3.0}O_{7-\delta}$ | 90% | 0.1 mm | 248 nm | 5 J/cm2 | 1.5.2.5 | 50.50 | 86K | 1.8 × 10⁷/cm² |

What is claimed is:

1. A method for manufacturing an oxide superconductor thin film, comprising the steps of:

preparing a target having an apparent density of 95% or more, substantially consisting of an oxide material represented by $Y_{1\pm\alpha}Ba_{2\pm\beta}Cu_{3\pm\gamma}O_{7-\delta}$ wherein $\alpha \leq 0.8$, $\beta \leq 0.4$, $\gamma \leq 0.4$, $-2 \leq \delta \leq 1$; and applying a laser beam to said target so as to evaporate an oxide material from the target and depositing the evaporated oxide material on a substrate, thereby forming on the substrate a thin film substantially consisting of $Y_{1\pm\alpha}Ba_{2\pm\beta}Cu_{3\pm\gamma}O_{7-\delta}$ wherein $\alpha \leq 0.8$, $\beta \leq 0.4$, $\gamma \leq 0.4$, $-2 \leq \delta \leq 1$.

2. A method according to claim 1, further comprising the steps of:

subjecting a molded body of amorphous powder to partial melting, and gradual cooling the body so as to obtain the target.

3. A method according to claim 1, said laser beam is a pulsed laser.

4. A method according to claim 1, said target has crystal grains of at least 1 mm or more in diameter.

5. A method according to claim 1, the crystal grain diameter of said target is larger than the beam diameter of a laser to be applied to the target.

6. A method according to claim 1, wherein crystal grains of said target have a precipitated and diffused $Y_2BaCuO_5$ phase comprised of precipitated grains having a diameter of 1 μm or less, and contained in an amount of 40%.

7. A method for manufacturing an oxide superconductor thin film, comprising the steps of:
preparing a target essentially consisting of a single crystalline oxide material formed by the Czochralski method represented by $Y_{1\pm\alpha}Ba_{2\pm\beta}Cu_{3\pm\gamma}O_{7-\delta}$ wherein $\alpha \leq 0.8$, $\beta \leq 0.4$, $\gamma \leq 0.4$, $-2 \leq \delta \leq 1$; and
applying a laser beam to the target formed of the single crystalline oxide material to evaporate the oxide material from the target, and depositing the evaporated oxide material on a substrate, thereby forming on the substrate a thin film substantially composed of $Y_{1\pm\alpha}Ba_{2\pm\beta}Cu_{3\pm\gamma}O_{7-\delta}$ wherein $\alpha \leq 0.8$, $\beta \leq 0.4$, $\gamma \leq 0.4$, $-2 \leq \delta \leq 1$.

8. A method according to claim 7, wherein said target is in the absence of a diffused and precipitated phase in the crystal grains.

9. A laser evaporation target for producing an oxide superconductor thin film having an apparent density of 95% or more and having substantial composition of $Y_{1\pm\alpha}Ba_{2\pm\beta}Cu_{3\pm\gamma}O_{7-\delta}$ wherein $\alpha \leq 0.8$, $\beta \leq 0.4$, $\gamma \leq 0.4$, $-2 \leq \delta \leq 1$, wherein the crystal grains of said target have a diameter larger than that of a laser beam applied to the target during laser evaporation.

10. A target according to claim 9, said target is a molded body of amorphous powder by subjecting it to partial melting, followed by gradual cooling.

11. A target according to claim 9, having crystal grains of 1 mm or more in diameter.

12. A target according to claim 9, wherein the crystal grains of said target have a diffused $Y_2BaCuO_5$ phase composed of precipitated grains having a diameter of 1 μm or less, and contained in an amount of 40%.

13. A laser evaporation target, for producing an oxide superconductor thin film having single crystalline material formed by the Czochralski method represented by $Y_{1\pm\alpha}Ba_{2\pm\beta}Cu_{3\pm\gamma}O_{7-\delta}$ wherein $\alpha \leq 0.8$, $\beta \leq 0.4$, $\gamma \leq 0.4$, $-2 \leq \delta \leq 1$.

14. A target according to claim 13, wherein said target is in the absence of precipitated and diffused particles in said single crystalline material.

* * * * *